United States Patent [19]

Chen et al.

[11] Patent Number: 4,933,304

[45] Date of Patent: Jun. 12, 1990

[54] METHOD FOR REDUCING THE SURFACE REFLECTANCE OF A METAL LAYER DURING SEMICONDUCTOR PROCESSING

[75] Inventors: Fusen Chen, Dallas; Yih-Shung Lin; Fu-Tai Liou, both of Carrollton, all of Tex.

[73] Assignee: SGS-Thomson Microelectronics, Inc., Carrollton, Tex.

[21] Appl. No.: 266,796

[22] Filed: Nov. 3, 1988

[51] Int. Cl.⁵ .................................... H01L 21/302
[52] U.S. Cl. .................................... 437/194; 437/288; 437/190; 437/192; 437/229; 148/DIG. 138; 148/DIG. 158; 430/278; 430/526
[58] Field of Search ............... 437/194, 228, 190, 192, 437/51; 148/DIG. 158, DIG. 138, DIG. 3; 430/275, 276, 278, 526

[56] References Cited

U.S. PATENT DOCUMENTS 4,680,250 7/1987 Kitamura et al. ............ 430/278
4,714,668 12/1987 Uneno et al. ............ 430/278
4,820,611 4/1989 Arnold, III et al. ............ 437/229

FOREIGN PATENT DOCUMENTS 0004220 1/1985 Japan ............ 437/194
0015330 1/1986 Japan ............ 437/194

Primary Examiner—Brian E. Hearn
Assistant Examiner—Tuan Nguyen
Attorney, Agent, or Firm—Gregory M. Howison; Kenneth C. Hill; Richard K. Robinson

[57] ABSTRACT

The method for producing the surface reflectance of the metal layer during semiconductor processing includes the step of roughening the surface of a metal layer prior to forming the photoresist thereon. The roughened surface reduces reflections that can cause metal notching effects. The step of roughening the surface includes depositing a layer (34) of aluminum which is substantially thinner than the thickness of the primary metal layer by a sputtering process.

10 Claims, 2 Drawing Sheets

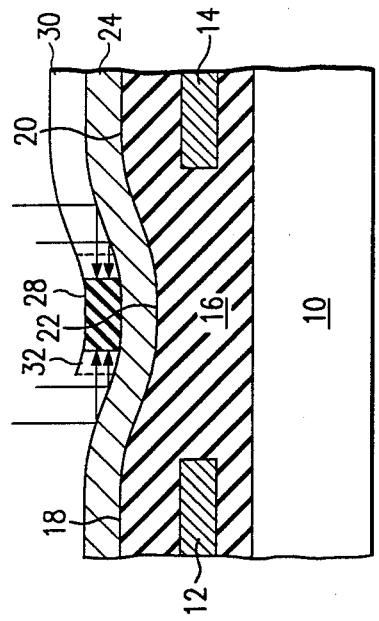
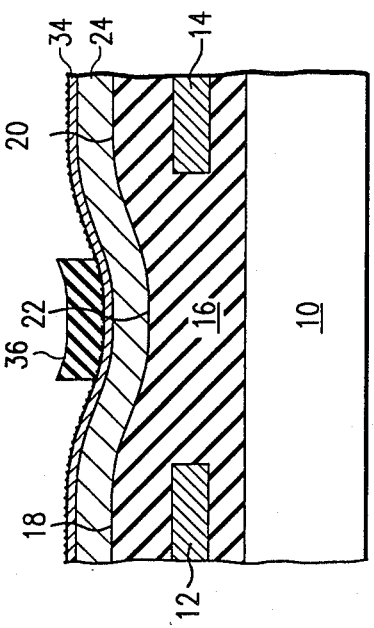
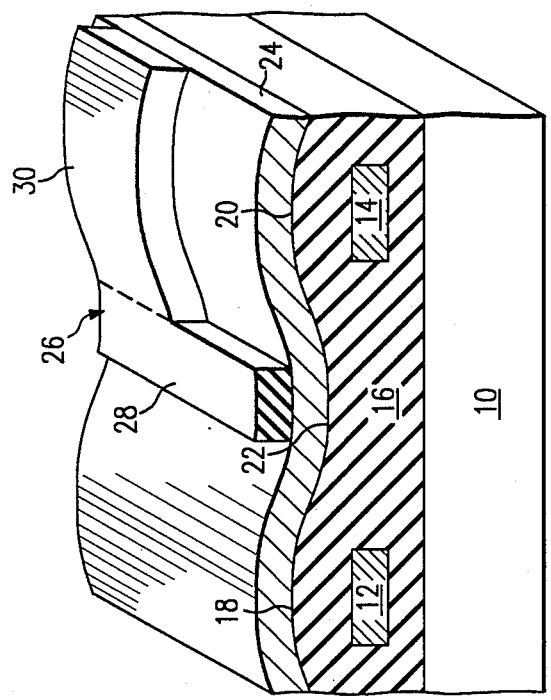
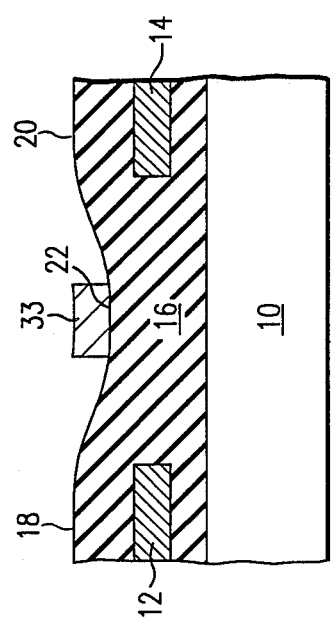
Fig. 1a (Prior Art)
Fig. 1b (Prior Art)
Fig. 1c (Prior Art)
Fig. 2

METHOD FOR REDUCING THE SURFACE REFLECTANCE OF A METAL LAYER DURING SEMICONDUCTOR PROCESSING

TECHNICAL FIELD OF THE INVENTION

The present invention pertains in general to patterning of metal layers and, more particularly, to reducing metal notching during patterning of an aluminum layer by reducing the surface reflectance thereof.

BACKGROUND OF THE INVENTION

During processing of the metal layers in a semiconductor structure, a phenomenon known as "metal notching" occurs for a high density pattern. Metal notching results in a line within a metal pattern that has a less than expected width due to inherent characteristics of the underlying structure. This results from the photoresist pattern being reduced in width below the expected pattern during developing thereof. Subsequent etching results in a smaller line within the metal pattern than was expected.

The reduction in the line width due to metal notching is a function of the surface reflectance of the underlying metal layer and the topology of the structure underlying the metal layer. Typically, the metal layer is a conformal layer that has very small peaks and valleys. When a portion of a patterned line lies within one of the valleys, it is necessary to deposit and pattern the photoresist in the valley to define this metal line. However, when developing the photoresist, the impinging light rays can be refracted towards the vertical sides of the pattern, thus reducing the width of the photoresist pattern. Subsequent etching of the metal layer with this pattern results in thinner than expected line widths. Typically, these valleys in the metal layer occur between underlying polycrystalline silicon lines which were fabricated in an earlier process step.

As surface densities increase and line widths decrease, this metal notching phenomenon becomes significantly disadvantageous. It is therefore necessary to develop a process whereby the width of the photoresist pattern is not reduced as a result of reflections from the surface of the metal layer.

SUMMARY OF THE INVENTION

The present invention disclosed and claimed herein comprises a method for forming a metal line on a semiconductor structure. The method includes first depositing a layer of primary metal onto the semiconductor structure with the primary metal layer having a predetermined reflectance. The surface of the primary metal is then processed to reduce the reflectance thereof. Thereafter, a layer of photoresist material is formed on the surface of the primary metal layer and then patterned and developed. The surface of the metal layer is then etched in accordance with the pattern to form the metal line.

In one aspect of the present invention, the step of reducing the reflectance comprises forming a thin layer of metal over the surface of the primary metal layer by sputtering techniques to a predetermined thickness. This predetermined thickness results in a reduction of surface reflectance.

In another aspect of the present invention, the primary metal layer is deposited by sputtering techniques and comprises aluminum. The secondary metal is also comprised of aluminum and is sputtered onto the primary aluminum layer and is sputtered on to a thickness of between 50–100Å. The primary metal layer is allowed to stabilize prior to sputtering on the secondary layer.

In yet another aspect of the present invention, the primary aluminum layer has a layer of native aluminum oxide formed on the surface thereof. This native aluminum oxide is removed by backsputtering techniques prior to formation of the secondary aluminum layer. Further, the primary metal layer is subjected to a rapid thermal anneal process whereby the surface thereof is roughened.

In yet a further aspect of the present invention, a barrier metal layer of titanium is formed on the surface of a semiconductor structure prior to formation of the primary metal layer. The barrier metal layer is formed to an increased thickness to provide a roughened surface thereon. This roughened surface on the barrier metal layer is reflected through to the surface of the primary metal layer, which layer is a conformal layer.

BRIEF DESCRIPTION OF THE DRAWINGS

For a more complete understanding of the present invention and the advantages thereof, reference is now made to the following description taken in conjunction with the accompanying Drawings in which:

FIGS. 1a–1c illustrate the metal notching of the prior art;

FIG. 2 illustrates a cross-sectional diagram of the substrate illustrating the inclusion of a roughened aluminum layer;

Figure 5:
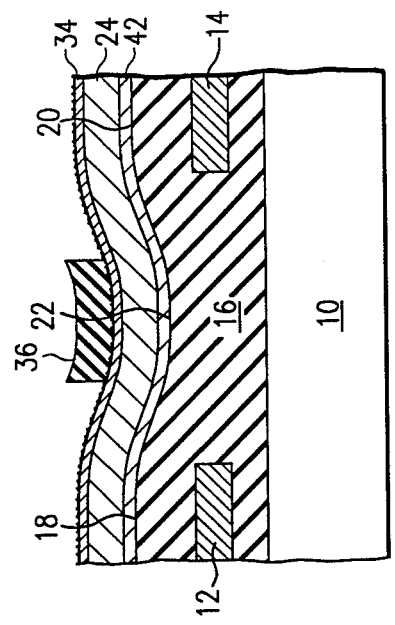
FIG. 5 illustrates an alternate embodiment of the invention utilizing a boundary layer of titanium.

It will be appreciated that for purposes of clarity and where deemed appropriate, reference numerals have been repeated in the figures to indicate corresponding features and that the cross-sectional diagrams have not necessarily been drawn to scale in order to more clearly show important features of the present invention.

DETAILED DESCRIPTION OF THE INVENTION

Referring now to FIGS. 1a–1c, there are illustrated cross-sectional diagrams of the prior art processing step that results in metal notching. In FIG. 1a, there is illustrated a perspective view of a semiconductor substrate illustrating the formation of a metal line between two underlying polycrystalline silicon lines (poly lines). A substrate 10 is provided having formed thereon a structure including a first poly line 12 and a second poly line 14 separated by a predetermined distance. Each of the poly lines 12 and 14 extend back into the structure and parallel with the surface of the substrate. Typically, the poly lines 12 and 14 are separated from the surface of the substrate 10 by either an oxide layer or a plurality of underlying layers of oxide and poly layers. However, for the purposes of this invention, the poly lines 12 and 14 represent any underlying structure that renders the surface of the structure non-planar.

In most typical semiconductor processes, prior to depositing a layer of metal onto the structure, a layer of interlevel oxide (ILO) 16 is deposited onto the substrate and then planarized. If the planarization step were not performed, this could result in large steps over the edges of the underlying structure such as the edges of the poly lines 12 and 14. With planarization, these steps are significantly reduced but the surface of the structure still has some undulations associated therewith. This results in the various peaks and valleys. In the structure of FIG. 1a, a peak or hill 18 is present over the upper surface of the poly line 12 and a peak 20 is seen over the surface of the poly line 14. Between the peaks 18 and 20, a valley 22 is formed.

After the ILO layer 16 is formed, a layer 24 of aluminum is sputtered onto the substrate to a thickness of approximately 5,000Å. After forming the aluminum layer 24, a pattern 26 of photoresist is formed on the upper surface of the aluminum layer 24 to define a desired metal pattern on the upper surface of the ILO layer 16. It can be seen that a portion of the pattern 26 lies parallel to the poly lines 12 and 14 in the valley 22, this portion being represented by a reference numeral 28. There is also a portion 30 that is at right angles to the portion 28 and extends over the peak region 20. The portion 28 is somewhat thinner than the portion 30 as a result of metal notching. As will be described with respect to FIG. 1b, the original pattern prior to developing of a photoresist layer requires the portions 28 and 30 to be essentially the same width.

Referring to FIG. 1b, there is illustrated a cross-sectional diagram of the structure of FIG. 1a, illustrating the portion 28 of the photoresist layer 26. Initially, the pattern for the photoresist layer was defined by a dotted line 32. However, since the patterned portion was disposed in the valley 22, vertically impinging light was reflected off of the undulating surface of the aluminum layer 24 and directed toward the vertical sides of the patterned photoresist. Therefore, the photoresist layer is patterned by exposing it to a photo activation source such as light, which, when impinging the exposed surfaces of the photoresist layer would activate them. Once activated, these activated portions would be removed by a later developing process. However, during the activation process, the light can pass through the photoresist layer down to the underlying surface of the metal layer 24. In the valley 22, these light rays are reflected off at an angle and will cause a portion of the photoresist layer in the patterned area to be activated from the outside edge inward. Thereafter, during the developing process, the edge of the patterned photoresist layer is decreased in width from the expected width. Of course, this is due to the concave surface of the aluminum layer 24 in the valley 22. After etching layer 24, the structure is illustrated in FIG. 1c with an aluminum line 33 being formed from the aluminum layer 24 underlying the photoresist portion 28.

Referring now to FIG. 2, there is illustrated a cross-sectional diagram of the structure of FIG. 1b utilizing the process of the present invention. After formation of the ILO layer 16, the structure is placed into a sputtering machine, such as a Varian 3190 sputtering machine. The layer 24 is then sputtered on to a thickness of approximately 5,000Å. The structure is then removed from the sputtering machine to allow it to cool down, at which time a thin layer of aluminum oxide is formed on the upper surface of the layer 24. This is not shown in FIG. 2. The structure is then reloaded into the sputtering machine and then a thin aluminum layer 34 is sputtered on at a much lower power level, approximately 10% (1200 watts) of the power level utilized to normally sputter on the layer 24. The sputtering operation has a duration of approximately one to twenty-five seconds, resulting in the aluminum layer 34 having a thickness of between 50–100Å.

When sputtering on a very thin layer of aluminum, the result is a surface that has a significantly increased roughness with a reflectance that varies between 30%–80%, with the reflectance of the aluminum layer 24 without the layer 34 disposed thereon being 100%. The percent reflectance is a function of the thickness of the layer 34, which reflectance is initially very high and then decreases as the thickness of the layer increases, which reflectance is minimum at a thickness of somewhere between 50–100Å. As the thickness exceeds 100Å, the reflectance increases until it approaches 100%.

Figure 3:
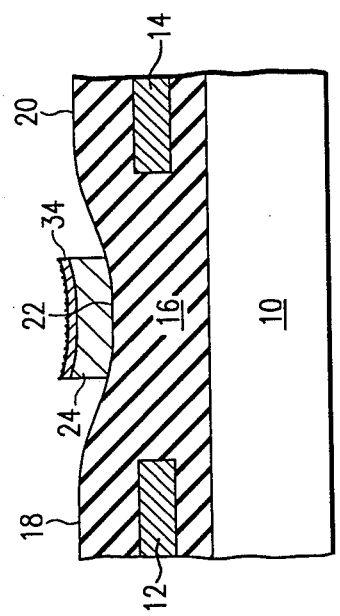
FIG. 3 illustrates the structure of FIG. 2 after etching.

After forming the layer 34, a layer of photoresist is disposed over the substrate and then activated and developed, resulting in a patterned portion 36. The patterned portion 36 has a width that is essentially equal to the desired pattern width since reflectance of impinging light during the developing of the photoresist layer is diffused such that light is not directed underneath the pattern to reduce the width of the patterned portion. The resulting structure after etching is illustrated in FIG. 3 with the formation of a structure 38 comprised of the patterned portion of the layer 24 and the patterned portion of the layer 34.

Figure 4A:
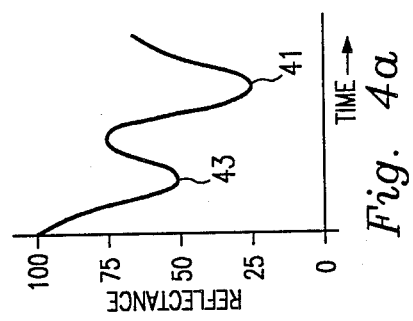
FIG. 4a illustrates a plot of reflectance vs. time for a thin layer of aluminum.
Figure 4:
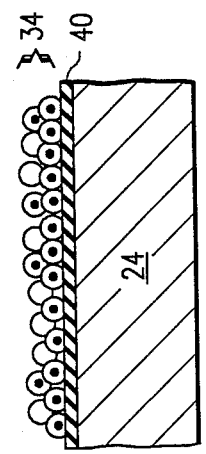
FIG. 4 illustrates a detail of the roughened layer.

Referring now to FIG. 4 there is illustrated a detail of the formation of the thin layer 34. Initially, the aluminum layer 24 has a layer of aluminum oxide 40 disposed on the surface thereof. This layer of aluminum oxide 40 is due to the removal of the structure from the sputtering machine after formation of the layer 24 and then subsequent return of the structure into the sputtering machine. On the surface of the oxide layer 40 are nucleation sites. These nucleation sites are the sites that the aluminum in the aluminum vapor adhere to during sputtering. Initially, the aluminum tends to clump around the nucleation sites resulting in a very rough surface. Of course, as the surface gets thicker and thicker, these clumps tend to become very homogenous and as such, the reflectance of the surface increases. However, in the very initial stages of the sputtering operation, the clumping is very uneven. It is this unevenness that has been recognized to present a roughened surface and thus, reduce the reflectance of the underlying surface of the aluminum layer 24. In addition, the surface is amorphous resulting in a higher absorption of light. It is believed that the reduction in reflectance is due to a combination of the roughened surface and the increased absorption.

In the initial stages of formation of the thin layer 34, it is believed that the nucleation and growth takes place by heterogenous nucleation. In this type of nucleation, transformations commonly begin on dislocation or on internal surfaces such as grain boundaries, intersections of three grains, stacking faults, and surfaces of impurity particles. This results in clumps at the various nucleation sites. As the material becomes thicker, the nucleation becomes more homogenous, resulting in a smoother surface.

Referring now to FIG. 4a, there is illustrated a plot of reflectance of the thin layer of aluminum as a function of time in the sputtering machine. Initially, the surface is at 100% reflectance due to the underlying surface of the aluminum layer 24. As the time increases, the reflectance decreases to a level of approximately 25% and then begins to increase. In the preferred embodiment, this time is approximately 15-25 seconds at the minimum reflectance value, represented by a minimum 41. However, the time required to reach the minimum reflectance is a function of two parameters. It is a function of the power setting of the sputtering machine and also a function of the time in the sputtering machine. These two parameters can be varied and the shape of the curve of FIG. 4a changed somewhat. However, the reflectance will always decrease to a minimum value and then increase and these parameters will merely provide a control of the surface reflectance on the layer 34. However, it should be understood that the time required to reach the minimum value is also a function of the underlying layer.

To further improve formation of the thin layer 34, the structure after formation of the aluminum layer 24 is placed into the sputtering machine and back sputtered with Argon for approximately twenty minutes at a medium power setting. This results in removal of the oxide layer 40 and in and of itself provides a certain degree of roughness. This essentially increases the nucleation sites. In addition, backsputtering provides two additional controls. The power and the time of the backsputtering provides two additional parameters to control the overall roughness of the surface 34. After backsputtering with Argon to remove the native oxide, the layer 34 is then formed by sputtering aluminum for a sufficient amount of time to form a layer having a thickness between 50-100Å of aluminum. With the use of backsputtering, the controls for forming the roughness of the surface are the power and time of backsputtering and then the power and time of sputtering on the thin layer 34. Backsputtering results in the second minimum 43 of FIG. 4a which occurs after approximately three seconds, resulting in a reflectance of approximately 50%. It is believed that the difference between the minimum 43 and the minimum 41 is due to the smoother surface that results from backsputtering. In the preferred embodiment, it is desirable to adjust the time such that the reflectance is located around the minimum 43 as opposed to the minimum 41.

Figure 6:
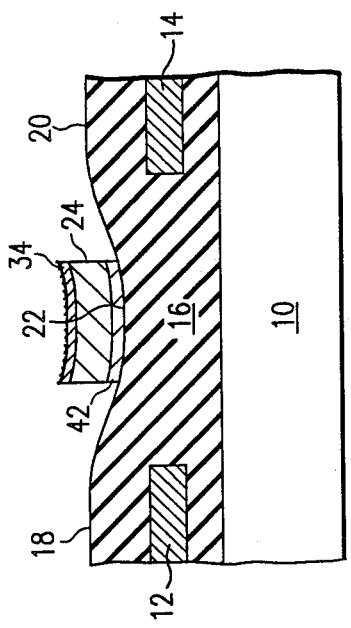
FIG. 6 illustrates the structure of FIG. 5 after etching.

Referring now to FIG. 5, there is illustrated a third embodiment to increase the roughness of the surface of the aluminum layer 24. Prior to formation of the aluminum layer 24, a barrier metal layer of titanium 42 is deposited on the upper surface of the ILO 16. It has been noticed that as the thickness of the titanium layer 42 increases, the surface thereof gets rougher. It has been noticed that the surface of the barrier metal layer of titanium 42 begins to get rougher at a thickness of approximately 1800Å. In the preferred embodiment, the thickness of the barrier metal of titanium 42 is approximately 2500Å. This results in an initial reflectance on the surface of the aluminum layer 24 of approximately 75%. This boundary layer 42 is typically used for adhesion purposes and is normally found in most processes. However, the thickness of the layer is purposefully increased beyond normal thicknesses to provide the increased roughness on the upper surface of the aluminum layer 24. After formation of the structure of FIG. 5, the upper surface of the aluminum layer and the thin layer 34 are etched resulting in the structure of FIG. 6 with an etched portion 44 defining the patterned line. The structure of 44 is comprised of a layer of titanium underlying a layer of aluminum underlying the thin layer of roughened aluminum.

In another embodiment of the present invention, the surface of the aluminum layer 24 has the reflectance reduced by a rapid thermal annealing (RTA) process. After depositing of the aluminum layer 24, the structure is subjected to an RTA process at a temperature of approximately 425° C. in $N_2$ or $H_2$ for approximately twenty minutes. This decreases the reflectance by between 5-15% depending upon the time of the annealing.

In summary, there has been provided a method for reducing metal notching by increasing the surface roughness of a metal layer after formation thereof. The increased roughness prevents decrease in the width of the patterned photoresist layer caused by surface reflections from the metal layer. The surface of the metal can be roughened by sputtering thereon a very thin layer of metal which provides a substantially reduced reflectance.

Although the preferred embodiment has been described in detail, it should be understood that various changes, substitutions and alterations can be made therein without departing from the spirit and scope of the invention as defined by the appended claims.

We claim:

1. A method for forming a metal line on a semiconductor structure, comprising:
   depositing a layer of metal over the semiconductor structure having a predetermined reflectance;
   sputtering on a thin layer of the same metal over the surface of the metal layer to a predetermined thickness;
   forming a layer of photoresist on the surface of the metal layer;
   patterning and developing the photoresist layer; and
   etching the metal layer in accordance with the patterned photoresist layer to form a pattern on the surface of the semiconductor structure.

2. A method for forming a metal line on a semiconductor structure, comprising:
   sputtering a primary layer of aluminum over the substrate to a predetermined thickness, the primary layer having a predetermined reflectance;
   allowing the primary layer of aluminum to stabilize, wherein a layer of aluminum oxide is formed on the surface thereof after stabilization;
   sputtering on a secondary layer of aluminum over the surface of the primary layer to a predetermined thickness such that the overall reflectance is reduced below the predetermined reflectance;
   forming a layer of photoresist on the surface of the secondary aluminum layer;
   patterning and developing the photoresist layer; and
   etching the combined primary aluminum layer and secondary aluminum layer in accordance with the patterned photoresist layer to form a pattern on the surface of the semiconductor substrate.

3. A method for forming a metal line on a semiconductor structure, comprising:
   sputtering a primary layer of aluminum over the substrate to a predetermined thickness, the primary layer having a predetermined reflectance;
   allowing the primary layer of aluminum to stabilize;
   back sputtering the primary layer of aluminum to remove native oxide;
   sputtering on a secondary layer of aluminum over the surface of the primary layer to a predetermined thickness such that the overall reflectance is reduced below the predetermined reflectance;

forming a layer of photoresist on the surface of the secondary aluminum layer;

patterning and developing the photoresist layer; and etching the combined primary aluminum layer and secondary aluminum layer in accordance with the patterned photoresist layer to form a pattern on the surface of the semiconductor substrate.

4. A method for forming a metal line on a semiconductor structure, comprising:

sputtering a primary layer of aluminum over the substrate to a predetermined thickness, the primary layer having a predetermined reflectance;

allowing the primary layer of aluminum to stabilize;

sputtering on a secondary layer of aluminum over the surface of the primary layer to a thickness of less than 100Å;

forming a layer of photoresist on the surface of the secondary aluminum layer;

patterning and developing the photoresist layer; and etching the combined primary aluminum layer and secondary aluminum layer in accordance with the patterned photoresist layer to form a pattern on the surface of the semiconductor substrate.

5. A method for forming a metal line on a semiconductor structure, comprising:

sputtering a primary layer of aluminum over the substrate to a predetermined thickness, the primary layer having a predetermined reflectance;

subjecting the primary layer of aluminum to a rapid thermal anneal process at a predetermined temperature and for a predetermined time to increase the roughness on the surface thereof;

allowing the primary layer of aluminum to stabilize;

sputtering on a secondary layer of aluminum over the surface of the primary layer to a predetermined thickness such that the overall reflectance is reduced below the predetermined reflectance;

forming a layer of photoresist on the surface of the secondary aluminum layer;

patterning and developing the photoresist layer; and etching the combined primary aluminum layer and secondary aluminum layer in accordance with the patterned photoresist layer to form a pattern on the surface of the semiconductor substrate.

6. A method for forming a metal line on a semiconductor structure, comprising:

forming a layer of barrier metal on the semiconductor structure to a thickness that increases the roughness on the barrier metal layer;

sputtering a primary layer of aluminum over the barrier metal layer to a predetermined thickness, the primary layer having a predetermined reflectance;

allowing the primary layer of aluminum to stabilize;

sputtering on a secondary layer of aluminum over the surface of the primary layer to a predetermined thickness such that the overall reflectance is reduced below the predetermined reflectance;

forming a layer of photoresist on the surface of the secondary aluminum layer;

patterning and developing the photoresist layer; and etching the combined primary aluminum layer and secondary aluminum layer in accordance with the patterned photoresist layer to form a pattern on the surface of the semiconductor substrate.

7. The method of claim 6 wherein the barrier metal is titanium and the thickness is greater than 1800Å.

8. A method for forming a metal line on a semiconductor structure, comprising:

sputtering a primary layer of aluminum over the substrate to a predetermined thickness, the primary layer having a predetermined reflectance;

allowing the primary layer of aluminum to stabilize;

sputtering on a secondary layer of aluminum over the surface of the primary layer with the secondary layer providing a substantial decrease in reflectance;

forming a layer of photoresist on the surface of the secondary aluminum layer;

patterning and developing the photoresist layer; and etching the combined primary aluminum layer and secondary aluminum layer to form the metal line.

9. A method for forming a metal line on a semiconductor structure, comprising;

forming a barrier metal layer of titanium on the surface of the semiconductor structure;

the barrier metal layer having a thickness that exceeds a predetermined thickness such that when the barrier metal layer of titanium exceeds the predetermined thickness, the roughness of the surface thereof is increased;

sputtering a primary layer of aluminum over the titanium layer to a predetermined thickness, the roughness of the titanium layer being translated to the surface of the primary aluminum layer, the primary layer having a predetermined reflectance;

allowing the primary layer of aluminum to stabilize;

sputtering on a thin layer of aluminum over the surface of the primary layer with the secondary layer providing a substantial decrease in reflectance;

forming a layer of photoresist on the surface of the secondary aluminum layer;

patterning and developing the photoresist layer; and etching the combined primary aluminum layer and secondary aluminum layer to form the metal line.

10. The method of claim 9 wherein the thickness of the barrier metal layer of titanium is greater than 1800Å.

* * * * *

UNITED STATES PATENT AND TRADEMARK OFFICE
CERTIFICATE OF CORRECTION

PATENT NO. : 4,933,304

DATED : June 12, 1990

INVENTOR(S) : Fusen Chen, Yih-Shung Lin, Fu-Tai Liou

It is certified that error appears in the above-identified patent and that said Letters Patent is hereby corrected as shown below:

Column 5, line 22, "twenty minutes" should read

--twenty seconds--.

Signed and Sealed this

Seventh Day of April, 1992

Attest:

HARRY F. MANBECK, JR.

*Attesting Officer*      *Commissioner of Patents and Trademarks*